United States Patent [19]

Hayashi et al.

[11] Patent Number: 5,115,123
[45] Date of Patent: May 19, 1992

[54] CONTACT TYPE PHOTOELECTRIC TRANSDUCER

[75] Inventors: Katsuhiko Hayashi; Minori Yamaguchi; Takehisa Nakayama, all of Kobe, Japan

[73] Assignee: Kanegafuchi Chemical Industry Co., Ltd., Osaka, Japan

[21] Appl. No.: 555,416

[22] PCT Filed: Dec. 13, 1989

[86] PCT No.: PCT/JP89/01247
§ 371 Date: Aug. 1, 1990
§ 102(e) Date: Aug. 1, 1990

[87] PCT Pub. No.: WO90/07195
PCT Pub. Date: Jun. 28, 1990

[30] Foreign Application Priority Data

Dec. 14, 1988 [JP] Japan .................. 63-315972
Mar. 17, 1989 [JP] Japan .................. 1-66749
Mar. 17, 1989 [JP] Japan .................. 1-66750
Mar. 17, 1989 [JP] Japan .................. 1-66751

[51] Int. Cl.⁵ ........................................ H01J 40/14
[52] U.S. Cl. ........................... 250/208.1; 357/30
[58] Field of Search ......... 250/211 J, 211 R, 208.1; 357/30 B

[56] References Cited

U.S. PATENT DOCUMENTS 4,348,611 9/1982 Ruppel et al. .................. 357/30 B
4,728,997 3/1988 Szydlo et al. .................. 250/211 J Primary Examiner—David C. Nelms
Attorney, Agent, or Firm—Jordan and Hamburg

[57] ABSTRACT

A photosensor comprises a first electrode layer, a light-transmitting second electrode layer, and a laminate structure disposed between the two electrode layers and comprising a first photoconductive layer, a blocking layer and a second photoconductive layer (4) for charge injection as a result of modification of the electrical properties of the first photoconductive layer and of the blocking layer, the main component of the first photoconductive layer being silicon, the blocking layer being made of a substance having a broader band gap as compared with hydrogenated amorphous silicon and composed mainly of silicon and carbon or mainly of silicon and nitrogen or mainly of silicon and oxygen, and the main component of the second photoconductive layer being silicon and the silicon of the second photoconductive layer being doped with an element(s) of the group III or V of the period table. In this photosensor, the bright current can be increased while the dark current remains suppressed as in the conventional photodiode type photoelectric transducer devices.

7 Claims, 3 Drawing Sheets

CONTACT TYPE PHOTOELECTRIC TRANSDUCER

TECHNICAL FIELD

This invention relates to an improvement in a photosensor. More particularly, it relates to an improvement in the contact type photoelectric transducer which comprises amorphous silicon as the main component.

BACKGROUND ART

The conventional contact image sensors may be classified into two types: photoconductor type and photodiode type. In the photoconductor type image sensors, their photoconductivity is utilized and a current proportional to the voltage applied can be obtained. However, they are disadvantageous in that the response speed is slow. Accordingly, the photodiode type image sensors, in which a layer of amporphous silicon carbide or the like is used as a blocking layer and in which the rectifying effect of the diode is utilized so that carriers photoelectrically generated alone can afford the output current, have become a focus of attention.

However, while the photodiode type is advantageous in that the bright/dark current ratio is greater as compared with the photoconductor type, the photodiode type still has a problem to be solved. Thus, the photocurrent intensity is limited to a level lower than 1 when expressed in terms of quantum efficiency. Accordingly, charge accumulation and amplification, for instance, are required, presenting difficulties from the circuit viewpoint.

It is an object of the invention to provide a photosensor in which the dark current is slight and the bright current is fairly strong.

DISCLOSURE OF THE INVENTION

The invention provides a photosensor which comprises a first electrode layer, a light-transmitting second electrode layer, and a laminate structure disposed between the two electrode layers and comprising a first photoconductive layer, a blocking layer and a second photoconductive layer for charge injection as a result of modification of the electrical properties of the first photoconductive layer and of the blocking layer, the main component of the first photoconductive layer being silicon, the blocking layer being made of a substance having a broader band gap as compared with hydrogenated amorphous silicon and composed mainly of silicon and carbon or mainly of silicon and nitrogen or mainly of silicon and oxygen, and the main component of the second photoconductive layer being silicon and the silicon of the second photoconductive layer being doped with an element(s) of group III of the periodic table or an element(s) of group V of the periodic table as an impurity(ies). In this photosensor, the bright current can be increased while the dark current remains suppressed.

In the above-mentioned photosensor, the magnitude of charge injection may be controlled by controlling the impurity level in the second photoconductive layer within the range of 1 ppm to 10,000 ppm.

In the above-mentioned photosensor, the magnitude of charge injection may be controlled by adjusting the thickness of the above-mentioned second photoconductive layer to a value not less than 20 angstroms but smaller than 5,000 angstroms.

In the above-mentioned photosensor, the magnitude of charge injection may be controlled by controlling the band gap of the above-mentioned blocking layer within the range of 1.7 eV to 6 eV.

In the above-mentioned photosensor, the magnitude of charge injection may be controlled by adjusting the thickness of the blocking layer to a value not less than 20 angstroms but smaller than 5,000 angstroms.

In the above-mentioned photosensor, an impurity(ies) of group III or group V of the periodic table may be added to the above-mentioned blocking layer.

In the above-mentioned photosensor, the magnitude of charge injection may be controlled by controlling the impurity level in the blocking layer within the range of 0 ppm to 10,000 ppm.

BEST MODES FOR CARRYING OUT THE INVENTION

EXAMPLE 1

Figure 1:
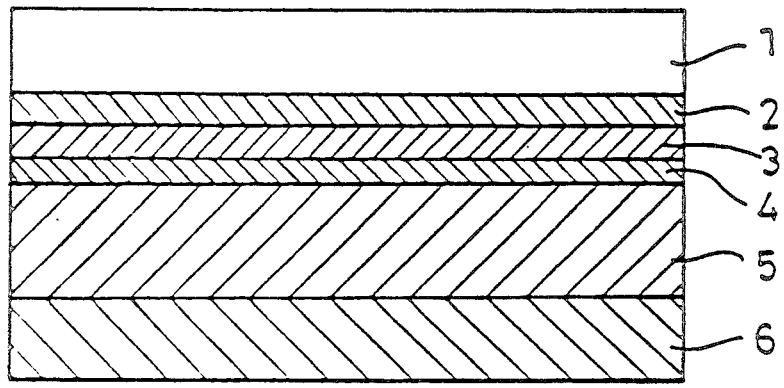
FIG. 1 shows, in longitudinal cross section, the photosensor of a first embodiment of the invention.

The structure of the first embodiment of the invention is shown in FIG. 1.

A transparent conductive layer is formed as the second electrode layer 2 on a transparent insulator substrate 1.

A thin film having an energy band gap of 1.7 eV to 6 eV, preferably 1.8 eV to 2.8 eV, and composed mainly of silicon and carbon or mainly of silicon and nitrogen or mainly of silicon and oxygen, in each case doped with 0 ppm to 10,000 ppm, preferably 2 ppm to 5,000 ppm, of an element(s) of group III of the periodic table or an element(s) of group V of the periodic table as an impurity(ies) is formed as the blocking layer 3 on the second electrode layer 2. The blocking layer 3 has a thickness not less than 20 angstroms but less than 5,000 angstroms, preferably not less than 50 angstroms and not more than 2,000 angstroms. When the layer 3 is thinner than 20 angstroms, blocking cannot be sufficient. When the layer thickness exceeds 5,000 angstroms, the sensitivity tends to decrease markedly.

Furthermore, on the layer 3, there is formed, as the impurity-containing photoconductive layer 4, a thin film of hydrogenated amorphous silicon doped with 1 ppm to 10,000 ppm of an element(s) of group III or V of the periodic table as an impurity(ies). The impurity addition level is preferably 2 ppm to 5,000 ppm. Its thickness is not less than 20 angstroms but less than 5,000 angstroms, preferably 50 to 2,000 angstroms.

On the layer 4, a thin film of impurity-free hydrogenated amorphous silicon is formed as the photoconductive layer 5.

An electrode layer is further formed thereon as the metallic first electrode layer 6. This electrode is made of one of the materials Cr, Al, Zr, Ti, Ni and W or an alloy or laminate structure composed of two o more of these materials. An n-type semiconductor layer can be inserted between the photoconductive layer and metal so that the metal and semiconductor layer ma have the ohmic characteristic.

EXAMPLE 2

Figure 2:
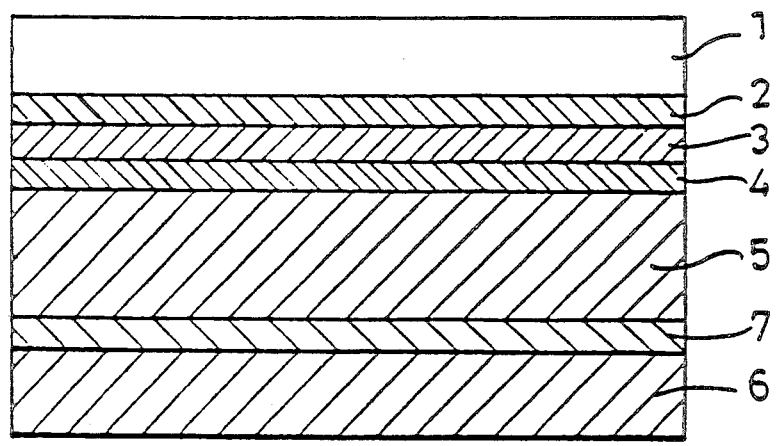
FIG. 2 shows, in longitudinal cross section, the photosensor of a second embodiment of the invention.

The structure of a second embodiment of the invention is illustrated in FIG. 2.

This photosensor has a blocking layer 7 disposed between the photoconductive layer 5 and the first electrode layer 6 in the photosensor of the first embodiment mentioned above.

As the blocking layer 7, there is formed a thin film having an energy band gap of 1.7 eV to 6 eV, preferably 1.8 eV to 2.8 eV, and composed mainly of silicon and carbon or mainly of silicon and nitrogen or mainly of silicon and oxygen, in each case doped with 0 ppm to 10,000 ppm, preferably 2 ppm to 5,000 ppm, of an element(s) of group III or V of the periodic table.

EXAMPLE 3

Figure 3:
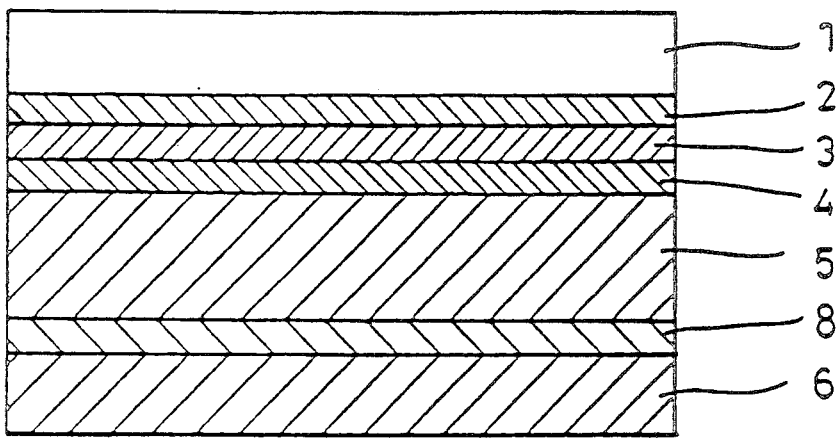
FIG. 3 shows, in longitudinal cross section, the photosensor of a third embodiment of the invention.

The structure of a third embodiment of the invention is illustrated in FIG. 3.

In this photosensor, an impurity-containing photoconductive layer 8 is disposed between the photoconductive layer 5 and the first electrode layer 6 in the photosensor of the first embodiment.

As the impurity-containing photoconductive layer 8, there is formed a thin film of hydrogenated amorphous silicon doped with 1 ppm to 10,000 ppm of an element(s) of group III or V of the periodic table.

EXAMPLE 4

Figure 4:
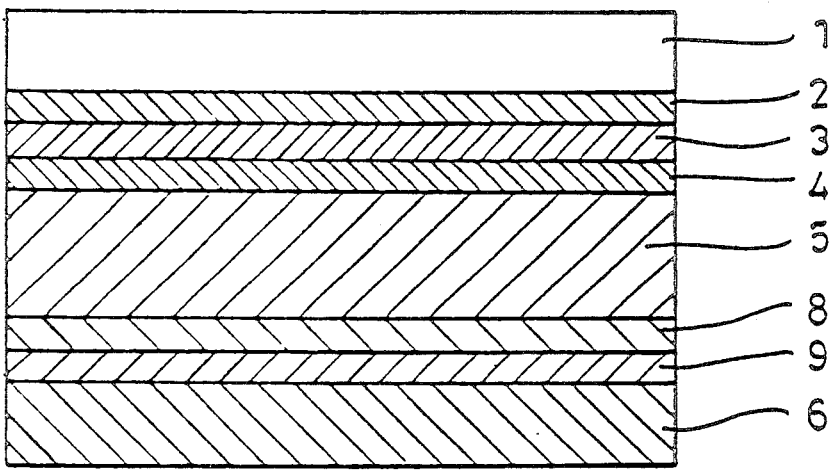
FIG. 4 shows, in longitudinal cross section, the photosensor of a fourth embodiment of the invention.

The structure of a fourth embodiment of the invention is illustrated in FIG. 4.

In this photosensor, an impurity-containing photoconductive layer 8 and a blocking layer 9 are disposed between the photoconductive layer 5 and the first electrode layer 6 in the photosensor of the first embodiment mentioned above.

As the impurity-containing photoconductive layer 8, there is formed a thin film of hydrogenated amorphous silicon doped with 1 ppm to 10,000 ppm of an element(s) of group III or V of the periodic table. Thereon is formed a blocking layer 9.

EXAMPLE 5

Figure 5:
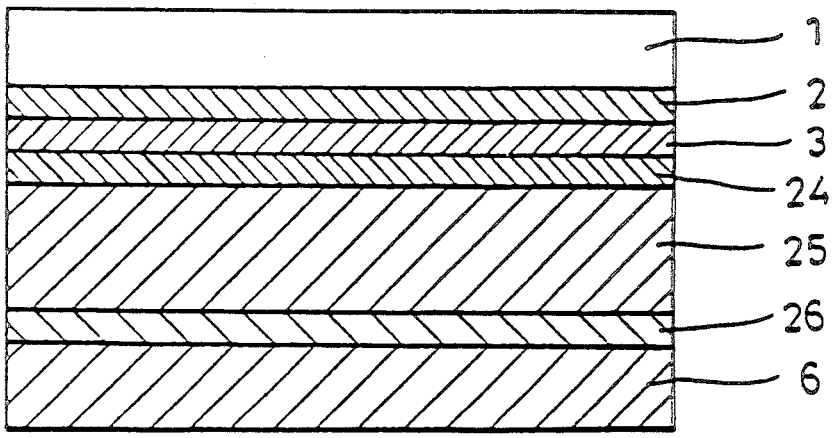
FIG. 5 shows, in longitudinal cross section, the photosensor of a fifth embodiment of the invention.

The structure of a still another embodiment of the invention is illustrated in FIG. 5. An ITO (indium tin oxide) layer is formed, as the light-transmitting second electrode layer 2, on a transparent glass insulator substrate 1 by EB vapor deposition.

Thereon is formed by plasma chemical vapor deposition (plasma CVD) a hydrogenated amorphous silicon carbide layer as the blocking layer 3, followed by formation thereon of a photoconductive layer 24 which is a hydrogenated amorphous silicon layer doped with phosphorus. Further thereon are formed a photo-conductive layer 25 which is an impurity-free hydrogenated amorphous silicon layer and a hydrogenated amorphous silicon layer 26 doped with phosphorus Furthermore, a Cr or Al layer is formed as the metallic first electrode layer 6 by EB vapor deposition.

Gaseous silane ($SiH_4$), gaseous methane ($CH_4$) and gaseous phosphine ($PH_3$) are used as the raw materials for plasma CVD.

Figure 6A:
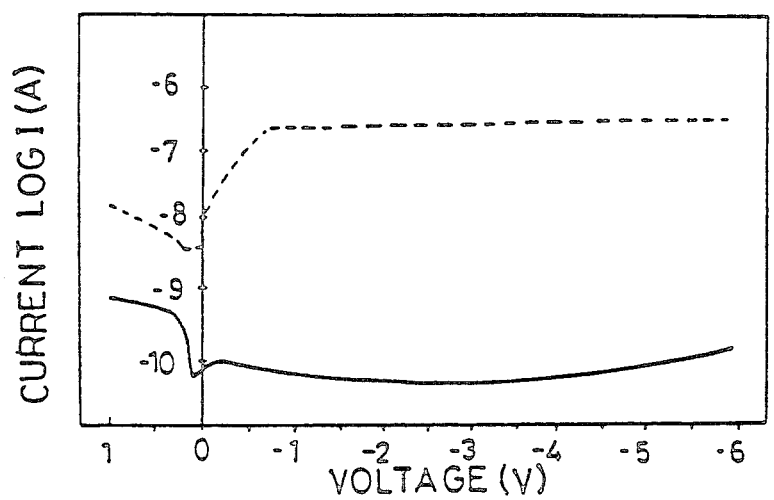
FIG. 6(a), 6(b) and 6(c) graphically show the voltage-current characteristics, on light irradiation and in the dark, of the photosensor of the fifth embodiment.
Figure 6B:
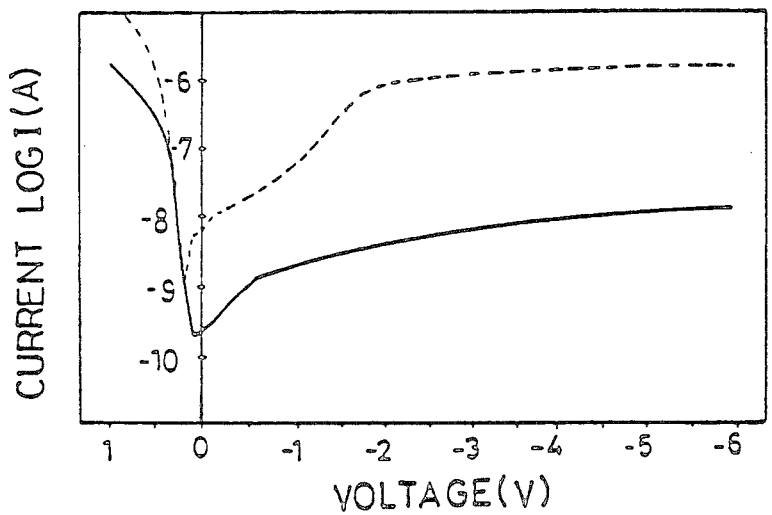
Figure 6C:
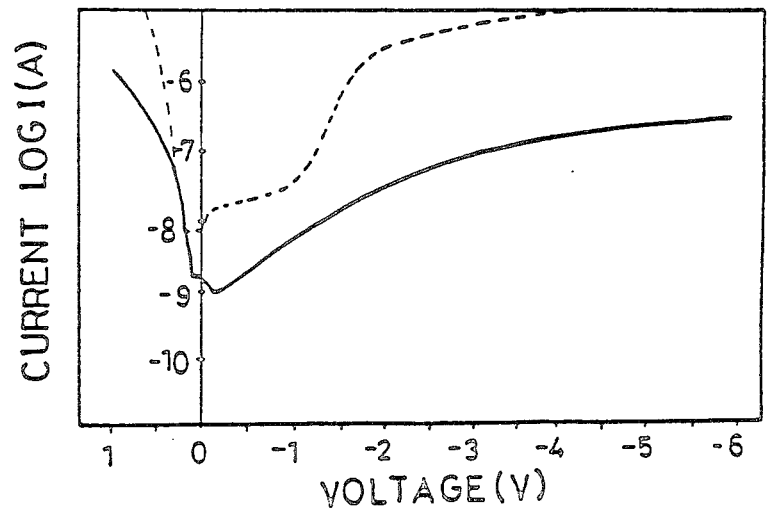

The voltage-current characteristics of a device not having impurity-containing hydrogenated amorphous silicon layers 24 and 26 on exposure to light and in the dark are shown in FIG. 6 (a) while those of two devices having such impurity-containing hydrogenated amorphous silicon layers 24 and 26 are shown in FIG. 6 (a) and in FIG. 6 (c). The voltage was applied in the so-called reverse bias manner, positively on the first electrode layer side and negatively on the second electrode layer side.

In FIGS. 6 (a), (b) and (c), the dotted line indicates the current during exposure to light and the solid line indicates the current in the dark.

In the devices having the constitution shown in FIG. 5 and respectively corresponding to the graphs shown in FIG. 6, the photoconductive layer 25 was a 20,000 angstrom thick hydrogenated amorphous silicon layer in each device (a, b or c), the impurity-containing photoconductive layer 24 was a 500 angstrom thick hydrogenated amorphous silicon layer doped with 100 ppm of phosphorus in the device b or with 500 ppm of phosphorus in the device c, and the impurity-containing photoconductive layer 26 was a 500 angstrom thick hydrogenated amorphous silicon layer doped with 5,000 ppm of phosphorus in the devices b and c.

An LED was used as the light source and the light emitted therefrom had a median wavelength of 540 nm. The illuminance was 100 1× and the device area was 3.14 $mm^2$.

At −5 V, the current flowing in the device a approximately corresponded to a quantum efficiency of 1 whereas the current in the device b was 8.5 times and the current in the device c was 51 times as much as that corresponding to the quantum efficiency of 1. The term "quantum efficiency" as used herein means the number of carriers generated per incident photon.

INDUSTRIAL APPLICABILITY

In accordance with the invention, it is possible to increase the bright current while suppressing the dark current as in the conventional photodiode type photoelectric transducer device. When the device according to the invention is used as a photosensor, it is possible to reduce the loads on the driver circuit, amplifier circuit and scanner circuit, make the sensor readily applicable and, furthermore, attain cost reduction. The invention thus contributes to expand the range of application of image sensors.

We claim:

1. A photosensor which comprises a first electrode layer, a light-transmitting second electrode layer, and a laminate structure disposed between the two electrode layers and comprising a first photoconductive layer, a blocking layer and a second photoconductive layer for charge injection, the main component of said first photoconductive layer being silicon, said blocking layer being made of a substance having a broader band gap than hydrogenated amorphous silicon and composed mainly of a member selected from the group consisting of (1) silicon and carbon, (2) silicon and nitrogen and (3) silicon and oxygen, and the main component of said second photoconductive layer being silicon and the silicon of said second photoconductive layer being doped with at least one element selected from groups III and V of he periodic table.

2. A photosensor as claimed in claim 1, wherein the concentration of the dopant in the second photoconductive layer is within the range of 1 ppm to 10,000 ppm.

3. A photosensor as claimed in claim 1, wherein the thickness of the second photoconductive layer is within the range of 20 angstroms to 5,000 angstroms.

4. A photosensor as claimed in claim 1, wherein the band gap of the blocking layer is within the range of 1.7 eV to 6 eV.

5. A photosensor as claimed in claim 1, wherein the magnitude of charge injection is controlled by controlling the thickness of the blocking layer within the range of 20 angstroms to 5,000 angstroms.

6. A photosensor as claimed in claim 1, wherein the blocking layer is doped with at least one element selected from groups III and V of the periodic table.

7. A photosensor as claimed in claim 6, wherein concentration of the dopant in the blocking layer is within the range of 0 ppm to 10,000 ppm.

* * * * *